United States Patent
Kuo et al.

(10) Patent No.: US 12,216,155 B2
(45) Date of Patent: Feb. 4, 2025

(54) TESTING METHOD AND TESTING SYSTEM

(71) Applicant: Realtek Semiconductor Corporation, Hsinchu (TW)

(72) Inventors: Yi-Nan Kuo, Hsinchu (TW); Ming-Chung Huang, Hsinchu (TW)

(73) Assignee: Realtek Semiconductor Corporation, Hsinchu (TW)

(*) Notice: Subject to any disclaimer, the term of this patent is extended or adjusted under 35 U.S.C. 154(b) by 216 days.

(21) Appl. No.: 17/936,850

(22) Filed: Sep. 30, 2022

(65) Prior Publication Data

US 2023/0128364 A1 Apr. 27, 2023

(30) Foreign Application Priority Data

Oct. 26, 2021 (TW) .................................. 110139621

(51) Int. Cl.
*G01R 31/28* (2006.01)

(52) U.S. Cl.
CPC ..... *G01R 31/2879* (2013.01); *G01R 31/2894* (2013.01)

(58) Field of Classification Search
CPC ............ G01R 31/2879; G01R 31/2894; G01R 19/16552; G01R 23/16; G01R 31/30
See application file for complete search history.

(56) References Cited

U.S. PATENT DOCUMENTS

| | | | | |
|---|---|---|---|---|
| 6,292,760 B1* | 9/2001 | Burns | ..................... | G01R 23/16 |
| | | | | 702/77 |
| 6,507,179 B1* | 1/2003 | Jun | .......................... | G05F 3/30 |
| | | | | 323/315 |
| 2002/0124713 A1* | 9/2002 | Sato | ......................... | G10H 1/06 |
| | | | | 84/622 |
| 2005/0137814 A1* | 6/2005 | Kelly | ..................... | G01R 29/26 |
| | | | | 702/69 |
| 2009/0134883 A1* | 5/2009 | Sofer | ..................... | G01R 29/26 |
| | | | | 324/613 |
| 2015/0253415 A1* | 9/2015 | Mazzaro | .................. | G01S 7/02 |
| | | | | 342/146 |
| 2019/0235545 A1* | 8/2019 | Zhang | ...................... | G05F 1/575 |

FOREIGN PATENT DOCUMENTS

CN 111537861 A 8/2020

* cited by examiner

*Primary Examiner* — Akm Zakaria
(74) *Attorney, Agent, or Firm* — CKC & Partners Co., LLC (57) ABSTRACT

An testing method includes following operations: generating, by a signal generator, a multi-tone signal; transmitting, by the signal generator, the multi-tone signal to an input terminal of an under-test device; measuring, by a spectrum analyzer, the input terminal of the under-test device and an output terminal of the under-test device to acquire a plurality of input ripple intensities corresponding to a plurality of frequencies and acquire a plurality of output ripple intensities corresponding to the frequencies; and generating, by a control device, a plurality of power supply rejection ratios corresponding to the frequencies according to the input ripple intensities and the output ripple intensities.

15 Claims, 8 Drawing Sheets

| frequency | $f_1$ | $f_2$ | $f_3$ | $f_4$ | $f_5$ | $f_6$ |
|---|---|---|---|---|---|---|
| input ripple intensity (dB) | -14.52 | 3.12 | 4.42 | 2.88 | -0.36 | -2.39 |
| output ripple intensity (dB) | -42.94 | -31.14 | -33.77 | -36.49 | -37.79 | -37.97 |
| power supply rejection ratio | 28.42 | 34.26 | 38.19 | 39.37 | 37.43 | 35.58 |

TESTING METHOD AND TESTING SYSTEM

RELATED APPLICATIONS

This application claims priority to Taiwanese Application Serial Number 110139621, filed Oct. 26, 2021, which is herein incorporated by reference.

BACKGROUND

Technical Field

The present disclosure relates to testing technology. More particularly, the present disclosure relates to a testing method and a testing system that can perform the testing process expeditiously.

Description of Related Art

The power supply rejection ratio (PSRR) is an important parameter used to evaluate rejection for the input ripple of a power circuit.

In some related approaches, an oscilloscope is used to measure the power supply rejection ratio in the time domain. However, the oscilloscope can only measure voltages in the millivolt level, so the power supply rejection ratio range that the oscilloscope can measure is limited (e.g., 40 to 50 decibels). Based on this limitation, when the power supply rejection ratio of an under-test device exceeds this range (e.g., 60 decibels), the oscilloscope is unable to accurately measure the power supply rejection ratio of the under-test device.

SUMMARY

Some aspects of the present disclosure are to provide a testing method. The testing method includes following operations: generating, by a signal generator, a multi-tone signal; transmitting, by the signal generator, the multi-tone signal to an input terminal of an under-test device; measuring, by a spectrum analyzer, the input terminal of the under-test device and an output terminal of the under-test device to acquire a plurality of input ripple intensities corresponding to a plurality of frequencies and acquire a plurality of output ripple intensities corresponding to the frequencies; and generating, by a control device, a plurality of power supply rejection ratios corresponding to the frequencies according to the input ripple intensities and the output ripple intensities.

Some aspects of the present disclosure are to provide a testing system. The testing system includes a signal generator, a spectrum analyzer, and a control device. The signal generator is configured to generate a multi-tone signal and transmit the multi-tone signal to an input terminal of an under-test device. The spectrum analyzer is coupled to the under-test device and configured to measure the input terminal of the under-test device and an output terminal of the under-test device to acquire a plurality of input ripple intensities corresponding to a plurality of frequencies and acquire a plurality of output ripple intensities corresponding to the frequencies. The control device is coupled to the spectrum analyzer and configured to generate a plurality of power supply rejection ratios corresponding to the frequencies according to the input ripple intensities and the output ripple intensities.

As described above, in the present disclose, the multi-tone signal is transmitted to the input terminal of the under-test device, and the spectrum analyzer can perform the multi-frequency measurement at the input terminal and the output terminal of the under-test device respectively so as to acquire the power supply rejection ratios corresponding to the frequencies expeditiously. In addition, since the measurement is performed on the frequency domain, the dynamic range of the measurement can be improved.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
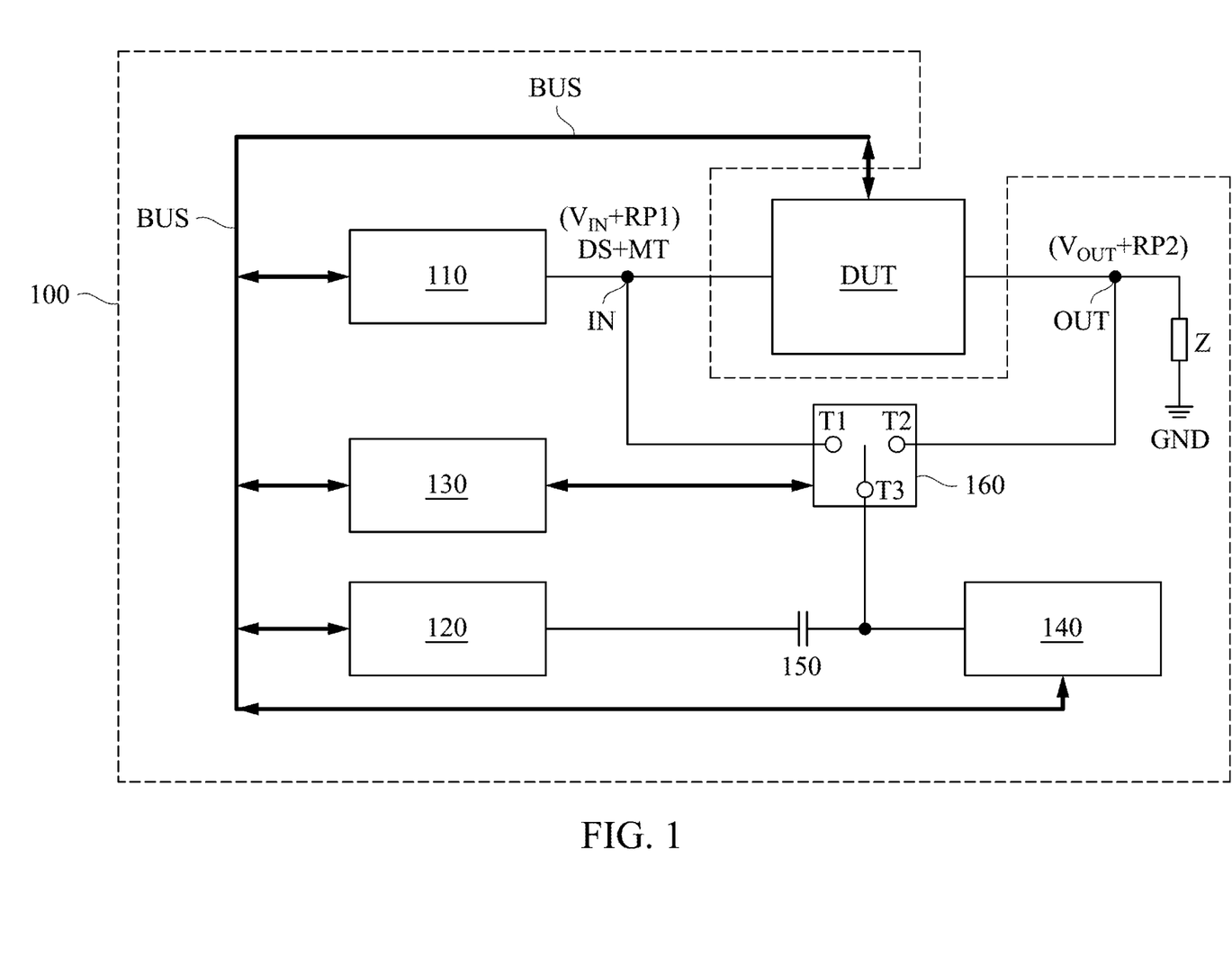
FIG. 1 is a schematic diagram of a testing system according to some embodiments of the present disclosure.

Reference is made to FIG. 1. FIG. 1 is a schematic diagram of a testing system 100 according to some embodiments of the present disclosure. The testing system 100 is configured to test an under-test device DUT to generate power supply rejection ratios of the under-test device DUT fast. In some embodiments, the under-test device DUT can be a power IC, and the testing system 100 can test the power IC to generate the power supply rejection ratios of this power IC.

As illustrated in FIG. 1, the testing system 100 includes a control bus BUS, a signal generator 110, a spectrum analyzer 120, a control device 130, a direct-current measuring device 140, a filter 150, and a switching device 160.

The signal generator 110, the spectrum analyzer 120, the control device 130, the direct-current measuring device 140, and the under-test device DUT are coupled to the control bus BUS. The signal generator 110 is coupled to an input terminal IN of the under-test device DUT. An output terminal OUT of the under-test device DUT is coupled to a load Z. The control device 130 is coupled to the switching device 160. The spectrum analyzer 120 is coupled to the filter 150. The filter 150 is coupled to the direct-current measuring device 140. The switching device 160 is coupled to the input terminal IN of the under-test device DUT, the output terminal OUT of the under-test device DUT, the filter 150, and the direct-current measuring device 140.

In some embodiments, the coupling between the signal generator 110 and the under-test device DUT can be implemented by a wire, and the coupling between the under-test device DUT and the load Z can be implemented by a wire. In some embodiments, the coupling between the switching device 160 and the input terminal IN can be implemented by a cable or a probe, and the coupling between the switching device 160 and the output terminal OUT can be implemented by a cable or a probe. In some embodiments, the coupling between the control device 130 and the switching device 160 can be implemented by another control bus.

The control device 130 can be a tablet, a laptop, a desktop computer, or other electronic device with controlling and data processing function. The filter 150 can be configured to filter direct-current components in signals such that only alternating-current components are passed for the spectrum analyzer 120 to measure. The switching device 160 can be a single pole double throw (SPDT) switch.

Figure 2:
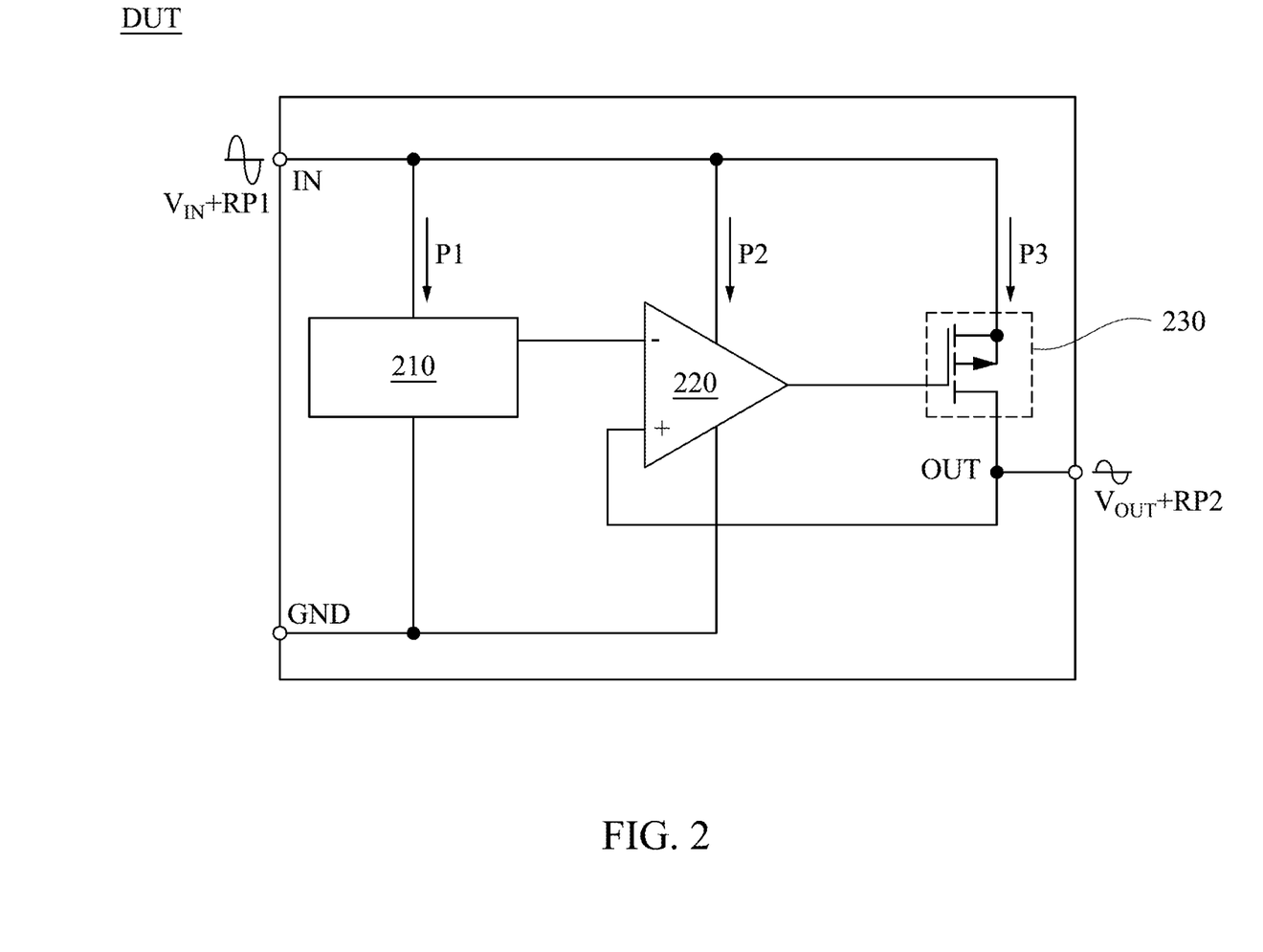
FIG. 2 is a schematic diagram of an under-test device in FIG. 1 according to some embodiments of the present disclosure.

Reference is made to FIG. 2. FIG. 2 is a schematic diagram of the under-test device DUT in FIG. 1 according to some embodiments of the present disclosure.

As described above, the under-test device DUT is, for example, a power IC, but the present disclosure is not limited thereto. As illustrated in FIG. 2, the under-test device DUT includes a reference circuit 210, an amplifier circuit 220, and a switching circuit 230. The reference circuit 210 and the amplifier circuit 220 are coupled between the input terminal IN and a ground terminal GND. A first input terminal (e.g., a negative input terminal) of the amplifier circuit 220 is coupled to the reference circuit 210, and a second input terminal (e.g., a positive input terminal) of the amplifier circuit 220 is coupled to the output terminal OUT. A first terminal of the switching circuit 230 is coupled to the input terminal IN, a second terminal of the switching circuit 230 is coupled to the output terminal OUT, and a control terminal of the switching circuit 230 is coupled to an output terminal of the amplifier circuit 220.

In some embodiments, the input terminal IN of the under-test device DUT can be configured to receive a direct-current input voltage $V_{IN}$ (e.g., 5 volts) and perform a voltage conversion process (e.g., buck) on the direct-current input voltage $V_{IN}$ to generate a direct-current output voltage $V_{OUT}$ (e.g., 3.3 volts).

However, in normal operations, in addition to the direct-current input voltage $V_{IN}$, an input ripple RP1 may exist at the input terminal IN. Since the under-test device DUT is a non-linear component, the input ripple RP1 at the input terminal IN causes an output ripple RP2 at the output terminal OUT after passing the under-test device DUT. For example, it is assumed that the input ripple RP1 is a baseband signal (e.g., 1M Hz), the output ripple RP2 includes a plurality of frequency multiplication sine waves (e.g., 2M Hz, 3M Hz). In addition, noises may exist on paths P1-P3, and these noises can contribute the output ripple RP2.

The testing system 100 in FIG. 1 can be configured to measure the input ripple RP1 at the input terminal IN and the output ripple RP2 at the output terminal OUT to generate the power supply rejection ratios of the under-test device DUT fast. How to generate the power supply rejection ratios of the under-test device DUT fast are described in following paragraphs.

Figure 3:
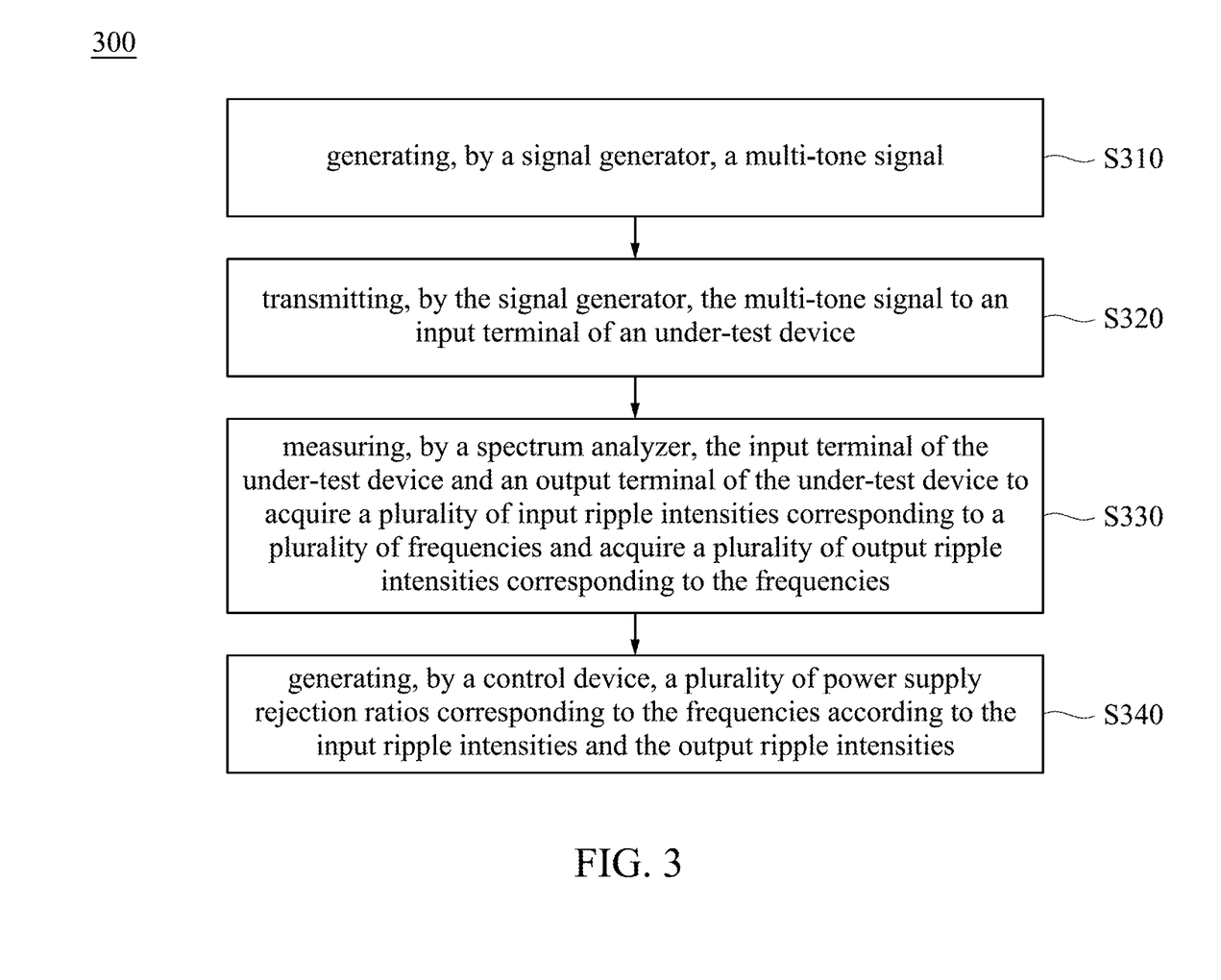
FIG. 3 is a flow diagram of a testing method according to some embodiments of the present disclosure.

References are made to FIG. 1 and FIG. 3. FIG. 3 is a flow diagram of a testing method 300 according to some embodiments of the present disclosure. In some embodiments, the testing method 300 is applied to the testing system 100 in FIG. 1, but the present disclosure is not limited thereto. The testing method 300 includes operations S310, S320, S330, and S340.

In operation S310, the signal generator 110 generates a multi-tone signal MT.

In some embodiments, the signal generator 110 can superimpose multiple sine waves in the time domain to generate the multi-tone signal MT, as following formula (1):

$$MT = A\sin(2\pi f_1 t) + A\sin(2\pi f_2 t) + \ldots A\sin(2\pi f_N t) \quad (1)$$

in which A is an amplitude, $f_1$-$f_N$ are different frequencies, and t is a timing point.

Figure 4:
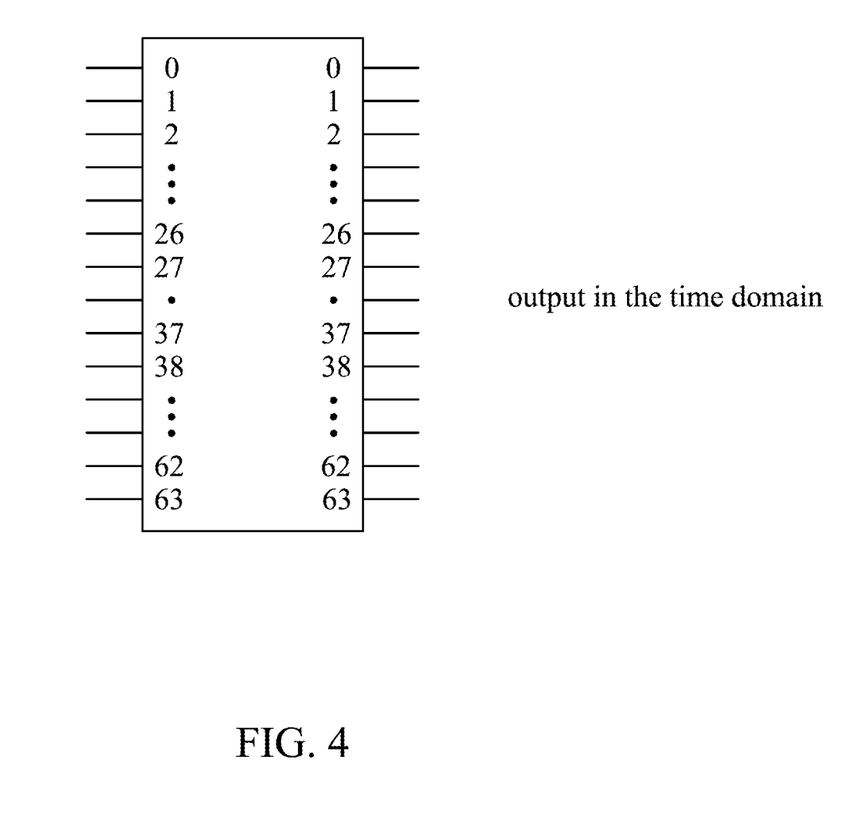
FIG. 4 is a schematic diagram of an inverse Fourier Transformation process according to some embodiments of the present disclosure.

In some other embodiments, the signal generator 110 can perform an inverse Fourier Transformation process in the frequency domain to generate the multi-tone signal MT. Reference is made to FIG. 4. FIG. 4 is a schematic diagram of an inverse Fourier Transformation process according to some embodiments of the present disclosure. For example, if the system sampling rate is 20M Hz and the number of frequency point is 64, it means that the output frequency resolution is 312.5K Hz. In this case, the first frequency point is 312.5K Hz, the second frequency point is 625K Hz, and so on. As illustrated in FIG. 4, if the output signal in the time domain intends to include components with the first frequency point (312.5K Hz), the first corresponding coefficient 0 is filled with "1". If the output signal in the time domain intends to exclude components with the second frequency point (625K Hz), the second corresponding coefficient 1 is filled with "0". With this principle, all corresponding coefficients are filled with appropriate values, and the signal generator 110 can perform the inverse Fourier Transformation process according to the corresponding coefficients and filled values to generate the multi-tone signal MT.

Reference is made to FIG. 3 again. In operation S320, the signal generator 110 transmits the multi-tone signal MT to the input terminal IN of the under-test device DUT. In some embodiments, the signal generator 110 is further configured to transmit a combination of a direct-current signal DS and the multi-tone signal MT to the input terminal IN of the under-test device DUT. It is noted that the direct-current signal DS plays a role as the direct-current input voltage $V_{IN}$, and the multi-tone signal MT plays a role as the input ripple RP1. The under-test device DUT works according to the combination of a direct-current signal DS and the multi-tone signal MT to generate a combination of the direct-current output voltage $V_{OUT}$ and the output ripple RP2 at the output terminal OUT.

In operation 330, the spectrum analyzer 120 measures the input terminal IN of the under-test device DUT and the output terminal OUT of the under-test device DUT respectively to acquire input ripple intensities and output ripple intensities. In some embodiments, the control device 130 controls the switching device 160 to couple the spectrum analyzer 120 to the input terminal IN or the output terminal OUT. In an embodiment, the spectrum analyzer 120 measures the input terminal IN of the under-test device DUT and the output terminal OUT of the under-test device DUT simultaneously to acquire input ripple intensities and output ripple intensities.

Figure 5A:
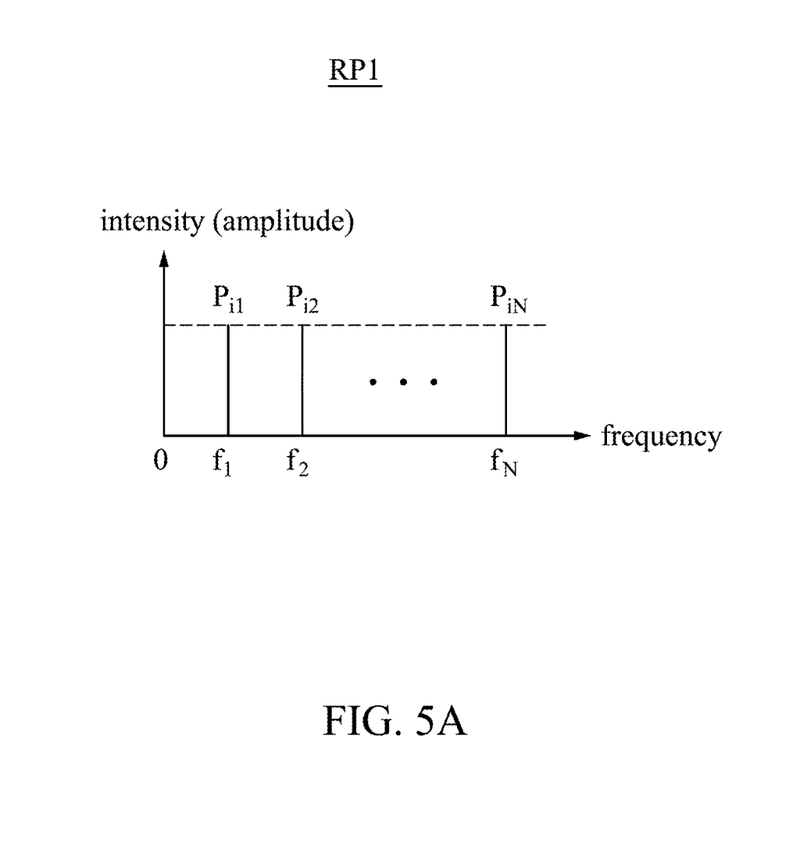
FIG. 5A to FIG. 5B are schematic diagrams of input ripple intensities and output ripple intensities according to some embodiments of the present disclosure.
Figure 5B:
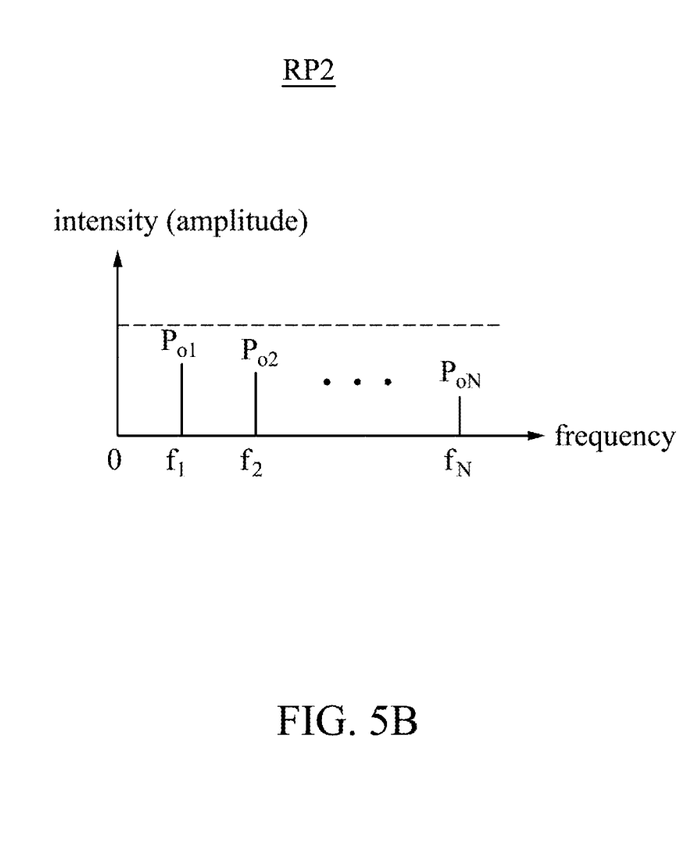

References are made to FIG. 5A and FIG. 5B. FIG. 5A to FIG. 5B are schematic diagrams of the input ripple intensities and the output ripple intensities according to some embodiments of the present disclosure. As illustrated in FIG. 5A, when the control device 130 controls the switching device 160 to couple the spectrum analyzer 120 to the input terminal IN, the spectrum analyzer 120 can measure the input terminal IN of the under-test device DUT to acquire input ripple intensities $P_{i1}$-$P_{iN}$. The input ripple intensities $P_{i1}$-$P_{iN}$ correspond to the frequencies $f_1$-$f_N$ of the multi-tone signal MT respectively. Similarly, as illustrated in FIG. 5B, when the control device 130 controls the switching device 160 to couple the spectrum analyzer 120 to the output terminal OUT, the spectrum analyzer 120 can measure the output terminal OUT of the under-test device DUT to acquire output ripple intensities $P_{o1}$-$P_{oN}$. The output ripple intensities $P_{o1}$-$P_{oN}$ correspond to the frequencies $f_1$-$f_N$ of the multi-tone signal MT respectively.

Reference is made to FIG. 3 again. In operation S340, the control device 130 generates the power supply rejection ratios corresponding to the frequencies $f_1$-$f_N$ according to the input ripple intensities $P_{i1}$-$P_{iN}$ and the output ripple intensities $P_{o1}$-$P_{oN}$.

Figure 6:
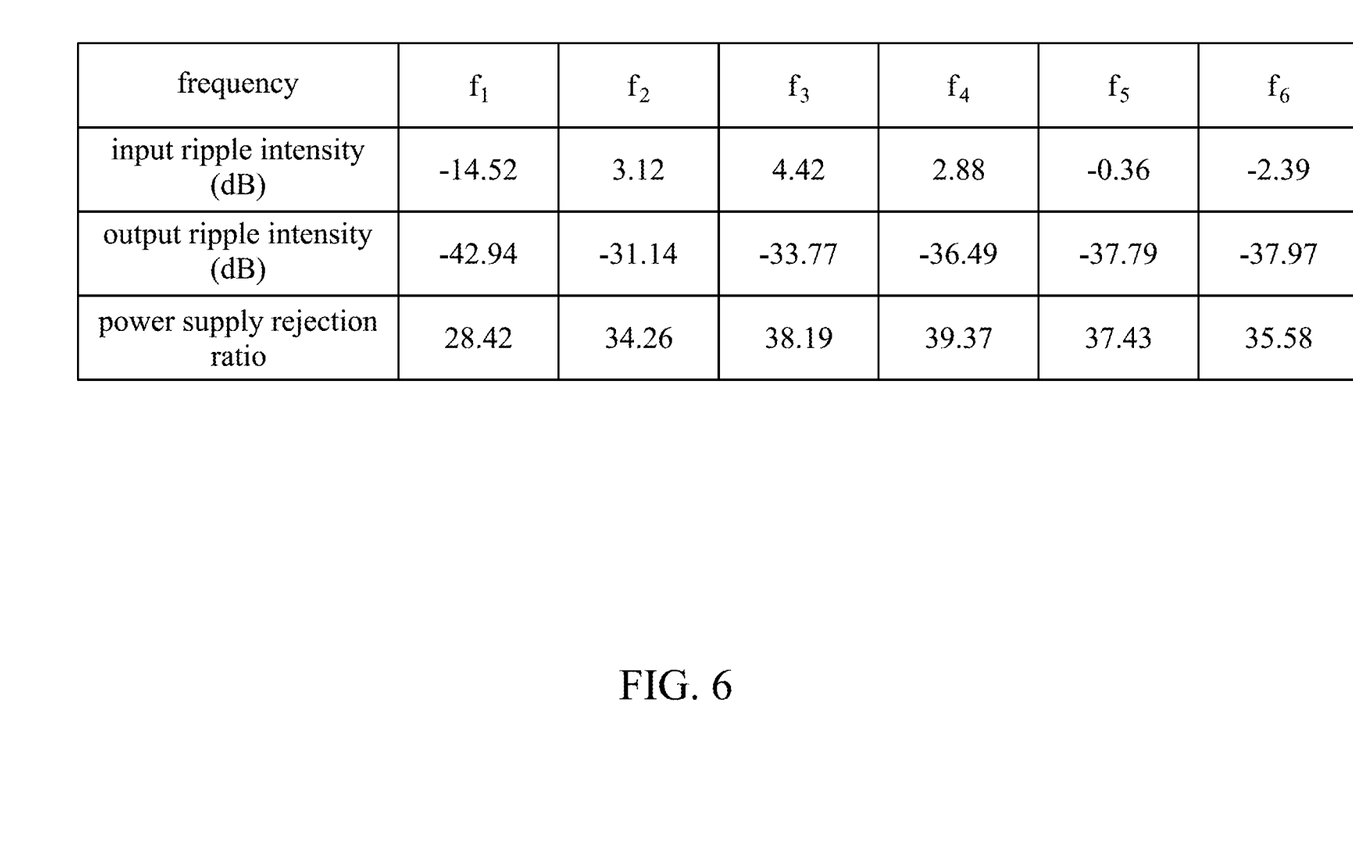
FIG. 6 is a schematic diagram of generating power supply rejection ratios according to some embodiments of the present disclosure.

Reference is made to FIG. 6. FIG. 6 is a schematic diagram of generating power supply rejection ratios according to some embodiments of the present disclosure.

In some embodiments, the control device 130 can subtract the output ripple intensity $P_{o1}$ corresponding to the frequency $f_1$ from the input ripple intensity $P_{i1}$ corresponding to the frequency $f_1$ to acquire the power supply rejection ratio corresponding to the frequency $f_1$. Based on similar principles, the control device 130 can subtract the output ripple intensity corresponding to one frequency from the input ripple intensity corresponding to this frequency to acquire the power supply rejection ratio corresponding to this frequency.

In some related approaches, an oscilloscope is used to measure the power supply rejection ratio in the time domain. However, the oscilloscope can only measure voltages in the millivolt level, so the power supply rejection ratio range that the oscilloscope can measure is limited (e.g., 40 to 50 decibels). Based on this limitation, when the power supply rejection ratio of an under-test device exceeds this range (e.g., 60 decibels), the oscilloscope is unable to accurately measure the power supply rejection ratio of the under-test device.

In addition, measurements which are performed on the time domain also have the problem of noises and frequency multiplication sine waves. To be more specific, the non-linear components cause a plurality of frequency multiplication sine waves. These frequency multiplication sine waves in in-phase or in out-phase may be superimposed as different output signals. This affects the measurement result and affects the power supply rejection ratio.

Compared to the aforementioned related approaches, the signal generator 110 in the present disclosure can generate the multi-tone signal MT, and transmit the combination of the multi-tone signal MT and the direct-current signal DS to the input terminal IN of the under-test device DUT. Then, the control device 130 in the present disclosure can control the spectrum analyzer 120 (e.g., by controlling the switching device 160) to be coupled to the input terminal IN of the under-test device DUT or to be coupled to the output terminal OUT of the under-test device DUT such that the spectrum analyzer 120 in the present disclosure can perform the multi-frequency measurement at the input terminal and the output terminal of the under-test device. Since the input terminal IN or the output terminal OUT only to be measured once, the power supply rejection ratios corresponding to different frequencies of the under-test device DUT can be measured fast. Thus, the present disclosure has the advantage of reducing testing time. In addition, since the measurement is performed on the frequency domain, the dynamic range of the measurement can be improved.

In some embodiments, the control device 130 can generate a result report according to the power supply rejection ratios generated in operation S340, and the result report can be displayed on a display panel of the control device 130. Thus, testers or circuit designers can learn the power supply rejection ratios corresponding to the frequencies $f_1$-$f_N$ fast, so as to adjust the circuit design or related parameters.

Figure 7:
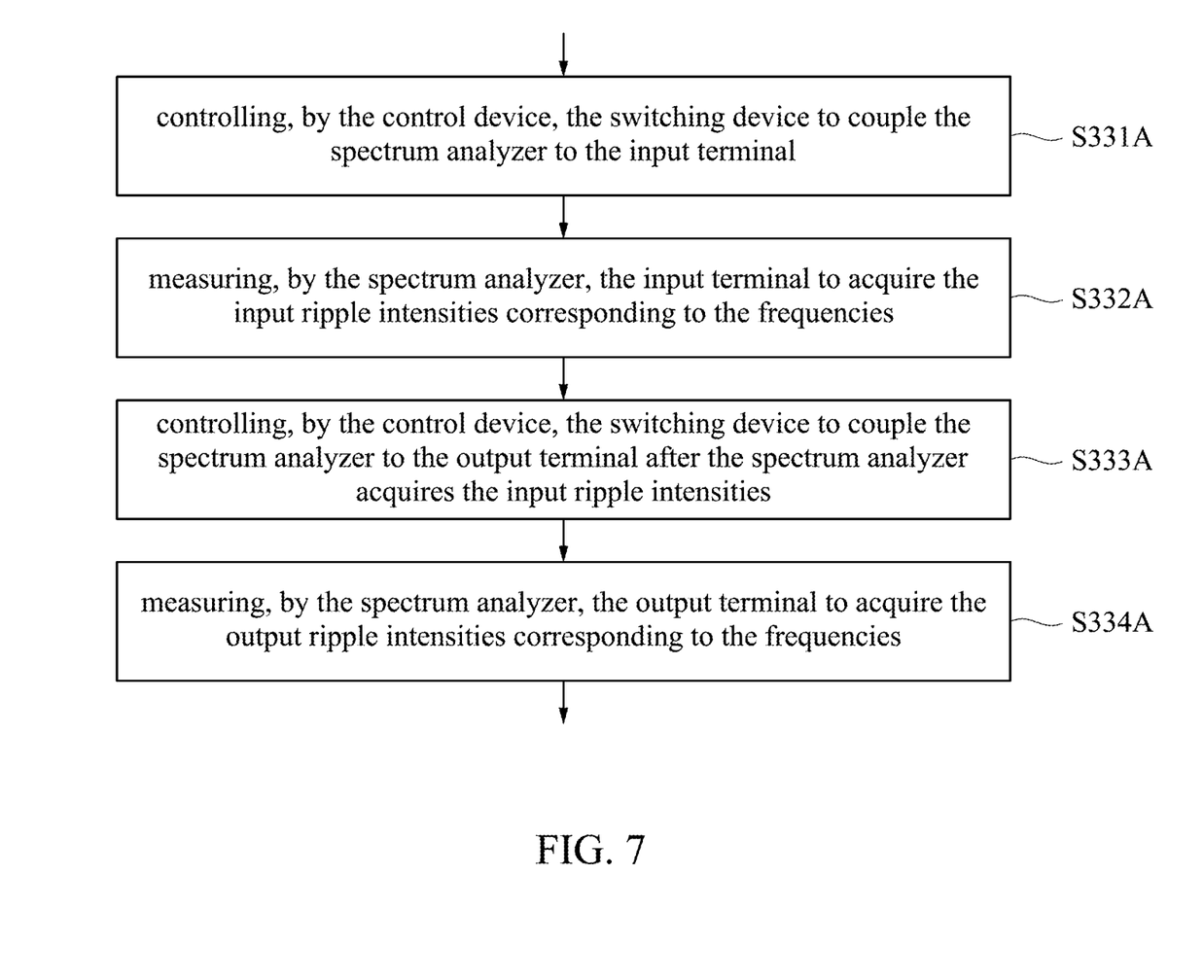
FIG. 7 is a flow diagram of details of an operation in FIG. 3 according to some embodiments of the present disclosure.

References are made to FIG. 1 and FIG. 7. FIG. 7 is a flow diagram of details of the operation S330 in FIG. 3 according to some embodiments of the present disclosure. FIG. 7 includes operations S331A, S332A, S333A, and S334A.

In operation S331A, the control device 130 controls the switching device 160 to couple the spectrum analyzer 120 to the input terminal IN first. As described above, the switching device 160 can be the single pole double throw switch. As illustrated in FIG. 1, the switching device 160 includes a switching terminal T1, a switching terminal T2, and a switching terminal T3. The control device 130 can control the switching terminal T3 to be coupled to the switching terminal T1 such that the spectrum analyzer 120 is coupled to the input terminal IN first.

In operation S332A, the spectrum analyzer 120 measures the input terminal IN to acquire the input ripple intensities $P_{i1}$-$P_{iN}$ corresponding to the frequencies $f_1$-$f_N$, as shown in FIG. 5A.

In operation S333A, after the spectrum analyzer 120 measures the input ripple intensities $P_{i1}$-$P_{iN}$, the control device 130 controls the switching device 160 to couple the spectrum analyzer 120 to the output terminal OUT. The control device 130 can control the switching terminal T3 to be coupled to the switching terminal T2 such that the spectrum analyzer 120 is coupled to the output terminal OUT.

In operation S334A, the spectrum analyzer 120 measures the output terminal OUT to acquire the output ripple intensities $P_{o1}$-$P_{oN}$ corresponding to the frequencies $f_1$-$f_N$, as shown in FIG. 5B.

In other words, in the case of FIG. 7, the spectrum analyzer 120 measures the input ripple intensities $P_{i1}$-$P_{iN}$ at the input terminal IN first, and then measure the output ripple intensities $P_{o1}$-$P_{oN}$ at the output terminal OUT.

Figure 8:
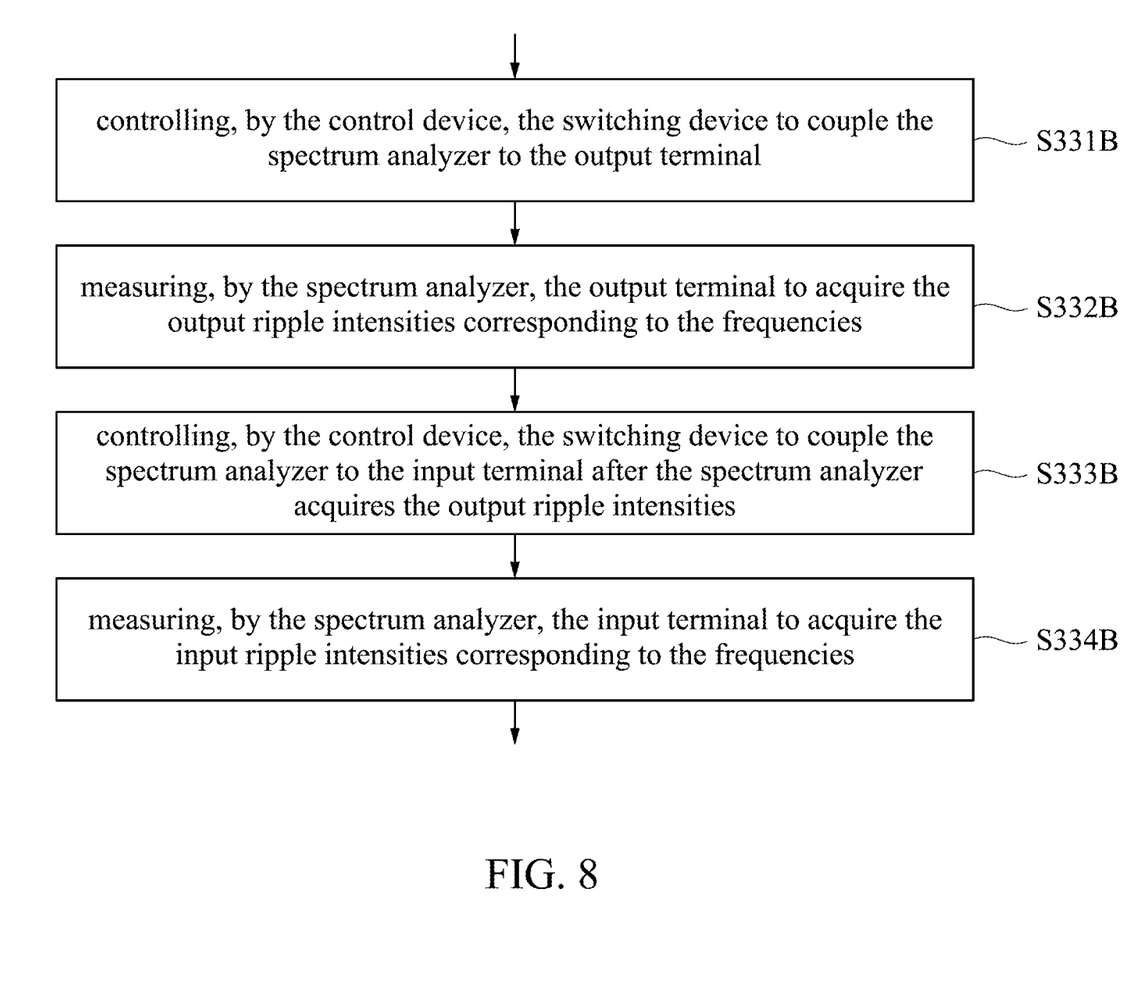
FIG. 8 is a flow diagram of details of an operation in FIG. 3 according to some embodiments of the present disclosure.

Reference is made to FIG. 8. FIG. 8 is a flow diagram of details of the operation S330 in FIG. 3 according to some embodiments of the present disclosure. FIG. 8 includes operations S331B, S332B, S333B, and S334B.

In operation S331B, the control device 130 controls the switching device 160 to couple the spectrum analyzer 120 to the output terminal OUT first. The control device 130 can control the switching terminal T3 to be coupled to the switching terminal T2 such that the spectrum analyzer 120 is coupled to the output terminal OUT first.

In operation S332B, the spectrum analyzer 120 measures the output terminal OUT to acquire the output ripple intensities $P_{o1}$-$P_{oN}$ corresponding to the frequencies $f_1$-$f_N$, as shown in FIG. 5B.

In operation S333B, after the spectrum analyzer 120 measures the output ripple intensities $P_{o1}$-$P_{oN}$, the control device 130 controls the switching device 160 to couple the spectrum analyzer 120 to the input terminal IN. The control device 130 can control the switching terminal T3 to be coupled to the switching terminal T1 such that the spectrum analyzer 120 is coupled to the input terminal IN.

In operation S334B, the spectrum analyzer 120 measures the input terminal IN to acquire the input ripple intensities $P_{i1}$-$P_{iN}$ corresponding to the frequencies $f_1$-$f_N$, as shown in FIG. 5A.

In other words, in the case of FIG. 8, the spectrum analyzer 120 measure the output ripple intensities $P_{o1}$-$P_{oN}$ at the output terminal OUT first, and then measures the input ripple intensities $P_{i1}$-$P_{iN}$ at the input terminal IN.

In some embodiments, when the control device 130 controls the switching terminal T3 to be coupled to the switching terminal T1, the direct-current measuring device 140 can measure an input direct-current component signal at the input terminal IN through this coupling relationship for the control device 130 or other analyzing device to analyze the direct-current characteristics. When the control device 130 controls the switching terminal T3 to be coupled to the switching terminal T2, the direct-current measuring device 140 can measure an output direct-current component signal at the output terminal OUT through this coupling relationship for the control device 130 or other analyzing device to analyze the direct-current characteristics.

As described above, in the present disclose, the multi-tone signal is transmitted to the input terminal of the under-test device, and the spectrum analyzer can perform the multi-frequency measurement at the input terminal and the output terminal of the under-test device respectively so as to acquire the power supply rejection ratios corresponding to the frequencies expeditiously. In addition, since the measurement is performed on the frequency domain, the dynamic range of the measurement can be improved.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A testing method, comprising:
   generating, by a signal generator, a multi-tone signal, wherein the multi-tone signal comprises a plurality of components with a plurality of frequencies;
   transmitting, by the signal generator, the multi-tone signal to an input terminal of an under-test device;
   measuring, by a spectrum analyzer, the input terminal of the under-test device and an output terminal of the under-test device to acquire a plurality of input ripple intensities corresponding to the frequencies and acquire a plurality of output ripple intensities corresponding to the frequencies, comprising:
      controlling, by a control device, a switching device to couple the spectrum analyzer to the input terminal;
      measuring, by the spectrum analyzer, the input terminal to acquire the input ripple intensities corresponding to the frequencies;
      controlling, by the control device, the switching device to couple the spectrum analyzer to the output terminal after the spectrum analyzer acquires the input ripple intensities; and
      measuring, by the spectrum analyzer, the output terminal to acquire the output ripple intensities corresponding to the frequencies; and
   generating, by the control device, a plurality of power supply rejection ratios corresponding to the frequencies according to the input ripple intensities and the output ripple intensities.

2. The testing method of claim 1, wherein the under-test device is a power IC.

3. The testing method of claim 1, further comprising:
   generating, by the control device, a result report according to the power supply rejection ratios corresponding to the frequencies.

4. The testing method of claim 1, further comprising:
   subtracting, by the control device, one of the output ripple intensities from one of the input ripple intensities to generate one of the power supply rejection ratios,
   wherein the one of the output ripple intensities, the one of the input ripple intensities, and the one of the power supply rejection ratios correspond to one of the frequencies.

5. The testing method of claim 1, further comprising:
   superimposing, by the signal generator, a plurality of sine waves to generate the multi-tone signal,
   wherein the sine waves correspond to the frequencies respectively.

6. The testing method of claim 1, further comprising:
   performing, by the signal generator, an inverse Fourier Transformation process to generate the multi-tone signal.

7. The testing method of claim 1, further comprising:
   transmitting, by the signal generator, a combination of the multi-tone signal and a direct-current signal to the input terminal of the under-test device; and
   measuring, by a direct-current measuring device, the input terminal of the under-test device and the output terminal of the under-test device respectively to acquire an input direct-current component signal and an output direct-current component signal.

8. A testing system, comprising:
   a signal generator configured to generate a multi-tone signal and transmit the multi-tone signal to an input terminal of an under-test device, wherein the multi-tone signal comprises a plurality of components with a plurality of frequencies;
   a spectrum analyzer coupled to the under-test device and configured to measure the input terminal of the under-test device and an output terminal of the under-test device to acquire a plurality of input ripple intensities corresponding to the frequencies and acquire a plurality of output ripple intensities corresponding to the frequencies;
   a control device coupled to the spectrum analyzer and configured to generate a plurality of power supply rejection ratios corresponding to the frequencies according to the input ripple intensities and the output ripple intensities; and
   a switching device,
   wherein the control device is configured to control the switching device to couple the spectrum analyzer to the input terminal, and the spectrum analyzer measures the input terminal to acquire the input ripple intensities corresponding to the frequencies, wherein after the spectrum analyzer acquires the input ripple intensities, the control device is further configured to control the switching device to couple the spectrum analyzer to the output terminal, and the spectrum analyzer measures the output terminal to acquire the output ripple intensities corresponding to the frequencies.

9. The testing system of claim 8, wherein the under-test device is a power IC.

10. A testing system, comprising:
    a signal generator configured to generate a multi-tone signal and transmit the multi-tone signal to an input terminal of an under-test device, wherein the multi-tone signal comprises a plurality of components with a plurality of frequencies;

a spectrum analyzer coupled to the under-test device and configured to measure the input terminal of the under-test device and an output terminal of the under-test device to acquire a plurality of input ripple intensities corresponding to the frequencies and acquire a plurality of output ripple intensities corresponding to the frequencies;

a control device coupled to the spectrum analyzer and configured to generate a plurality of power supply rejection ratios corresponding to the frequencies according to the input ripple intensities and the output ripple intensities; and a switching device, wherein the control device is configured to control the switching device to couple the spectrum analyzer to the output terminal, and the spectrum analyzer measures the output terminal to acquire the output ripple intensities corresponding to the frequencies, wherein after the spectrum analyzer acquires the output ripple intensities, the control device is further configured to control the switching device to couple the spectrum analyzer to the input terminal, and the spectrum analyzer measures the input terminal to acquire the input ripple intensities corresponding to the frequencies.

11. The testing system of claim 10, wherein the switching device is a single pole double throw switch.

12. The testing system of claim 10, wherein the control device is further configured to subtract one of the output ripple intensities from one of the input ripple intensities to generate one of the power supply rejection ratios, wherein the one of the output ripple intensities, the one of the input ripple intensities, and the one of the power supply rejection ratios correspond to one of the frequencies.

13. The testing system of claim 10, wherein the signal generator is further configured to superimpose a plurality of sine waves to generate the multi-tone signal, wherein the sine waves correspond to the frequencies respectively.

14. The testing system of claim 10, wherein the signal generator is further configured to perform an inverse Fourier Transformation process to generate the multi-tone signal.

15. The testing system of claim 10, wherein the signal generator is further configured to transmit a combination of the multi-tone signal and a direct-current signal to the input terminal of the under-test device.

* * * * *